United States Patent
Kishi et al.

(10) Patent No.: US 12,016,248 B2
(45) Date of Patent: Jun. 18, 2024

(54) VIBRATION DEVICE

(71) Applicant: Murata Manufacturing Co., Ltd., Nagaokakyo (JP)

(72) Inventors: Noritaka Kishi, Nagaokakyo (JP); Takahide Nakadoi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 587 days.

(21) Appl. No.: 17/376,207

(22) Filed: Jul. 15, 2021

(65) Prior Publication Data

US 2021/0359193 A1 Nov. 18, 2021

Related U.S. Application Data

(63) Continuation of application No. PCT/JP2020/048772, filed on Dec. 25, 2020.

(30) Foreign Application Priority Data

May 15, 2020 (JP) ................... 2020-086019

(51) Int. Cl.
| | | |
|---|---|---|
| H01L 41/08 | (2006.01) | |
| G02B 27/00 | (2006.01) | |
| G03B 17/08 | (2021.01) | |
| H10N 30/00 | (2023.01) | |
| H10N 30/20 | (2023.01) | |
| H10N 30/87 | (2023.01) | |

(52) U.S. Cl.
CPC ......... *H10N 30/20* (2023.02); *G02B 27/0006* (2013.01); *G03B 17/08* (2013.01); *H10N 30/10516* (2023.02); *H10N 30/87* (2023.02)

(58) Field of Classification Search
CPC ... H10N 30/20; H10N 30/10516; H10N 30/87
USPC ....................................... 310/323.01–323.21
See application file for complete search history.

(56) References Cited

U.S. PATENT DOCUMENTS

| | | | |
|---|---|---|---|
| 5,798,598 A * | 8/1998 | Fujimoto | ............... H02N 2/163 |
| | | | 310/323.04 |
| 8,899,761 B2 | 12/2014 | Tonar et al. | |
| 2006/0028095 A1 | 2/2006 | Maruyama et al. | |
| 2015/0349666 A1* | 12/2015 | Ifuku | ................. H10N 30/8536 |
| | | | 29/25.35 |

(Continued)

FOREIGN PATENT DOCUMENTS

| | | |
|---|---|---|
| JP | 03-70654 A | 3/1991 |
| JP | 2535727 Y2 | 5/1997 |
| JP | 2006-048302 A | 2/2006 |

(Continued)

OTHER PUBLICATIONS

Official Communication issued in International Patent Application No. PCT/JP2020/048772, mailed on Mar. 16, 2021.

*Primary Examiner* — Derek J Rosenau

(74) *Attorney, Agent, or Firm* — Keating & Bennett, LLP

(57) ABSTRACT

A vibration device includes a tubular body with a cavity, a first opening end surface, and a second opening end surface, a piezoelectric device joined to the first opening end surface, and a translucent cover joined to the second opening end surface. The tubular body and the piezoelectric device are joined to each other with a first adhesive layer, and the tubular body and the translucent cover are joined to each other with a second adhesive layer.

17 Claims, 6 Drawing Sheets

(56) References Cited

U.S. PATENT DOCUMENTS

2018/0095272 A1 4/2018 Fujimoto et al.
2018/0210194 A1 7/2018 Nishiyama et al.

FOREIGN PATENT DOCUMENTS

WO 2017/022382 A1 2/2017
WO 2017/110564 A1 6/2017

* cited by examiner

VIBRATION DEVICE

CROSS REFERENCE TO RELATED APPLICATIONS

This application claims the benefit of priority to Japanese Patent Application No. 2020-086019 filed on May 15, 2020 and is a Continuation Application of PCT Application No. PCT/JP2020/048772 filed on Dec. 25, 2020. The entire contents of each application are hereby incorporated herein by reference.

BACKGROUND OF THE INVENTION

1. Field of the Invention

The present invention relates to a vibration device capable of removing waterdrops and other matter with mechanical vibrations.

2. Description of the Related Art

Imaging devices such as cameras used as monitoring devices have been demanded to keep their field of vision clear. Particularly, for outdoor-use cameras such as vehicle-mounted cameras, various types of mechanism for removing waterdrops such as raindrops have been developed. U.S. Pat. No. 8,899,761 discloses an example of a vibration device. This vibration device includes a piezoelectric device attached to a lens cover with a connector interposed therebetween. In addition, a housing is attached to the piezoelectric device with an insulator interposed therebetween. The housing accommodates a light sensor. The piezoelectric device vibrates the lens cover to remove droplets adhering to the lens cover.

U.S. Pat. No. 8,899,761 describes use of an epoxy adhesive for joining a connector made of a metal and the piezoelectric device. When the metal used for the connector and the piezoelectric device have a large difference in coefficient of linear expansion, thermal stress increases. The thermal stress may cause removal of the piezoelectric device from the connector or cracking of the piezoelectric device. An adhesive used for joining the lens cover and the connector to each other may damp vibrations.

SUMMARY OF THE INVENTION

Preferred embodiments of the present invention provide vibration devices that are each able to reduce stress imposed on components without reducing displacement of a translucent cover to which waterdrops and other matter adhere.

A vibration device according to a preferred embodiment the present invention includes a tubular body including a cavity, a first opening end surface, and a second opening end surface, a vibrating element joined to the first opening end surface of the tubular body, and a translucent cover joined to the second opening end surface of the tubular body to cover the cavity of the tubular body. The tubular body and the vibrating element are joined to each other with a first adhesive layer. The tubular body and the translucent cover are joined to each other with a second adhesive layer. When a thickness of the first adhesive layer is denoted with t1, a thickness of the second adhesive layer is denoted with t2, an absolute value of deformation of the first adhesive layer in a thickness direction of the first adhesive layer when a first stress is imposed on the first adhesive layer in the thickness direction is denoted with |Δt1|, and an absolute value of deformation of the second adhesive layer in a thickness direction of the second adhesive layer when a second stress is imposed on the second adhesive layer in the thickness direction is denoted with |Δt2|, a relationship between the absolute value |Δt1| and the absolute value |Δt2| when the first adhesive layer and the second adhesive layer receive equal stress is |Δt1|>|Δt2|.

Vibration devices according to preferred embodiments of the present invention are each able to reduce stress imposed on components without reducing displacement of a translucent cover to which waterdrops and other matter adhere.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings below to clarify the present invention.

Preferred embodiments described herein are mere examples, and components between different preferred embodiments may be partially replaced or combined with each other.

Figure 1:
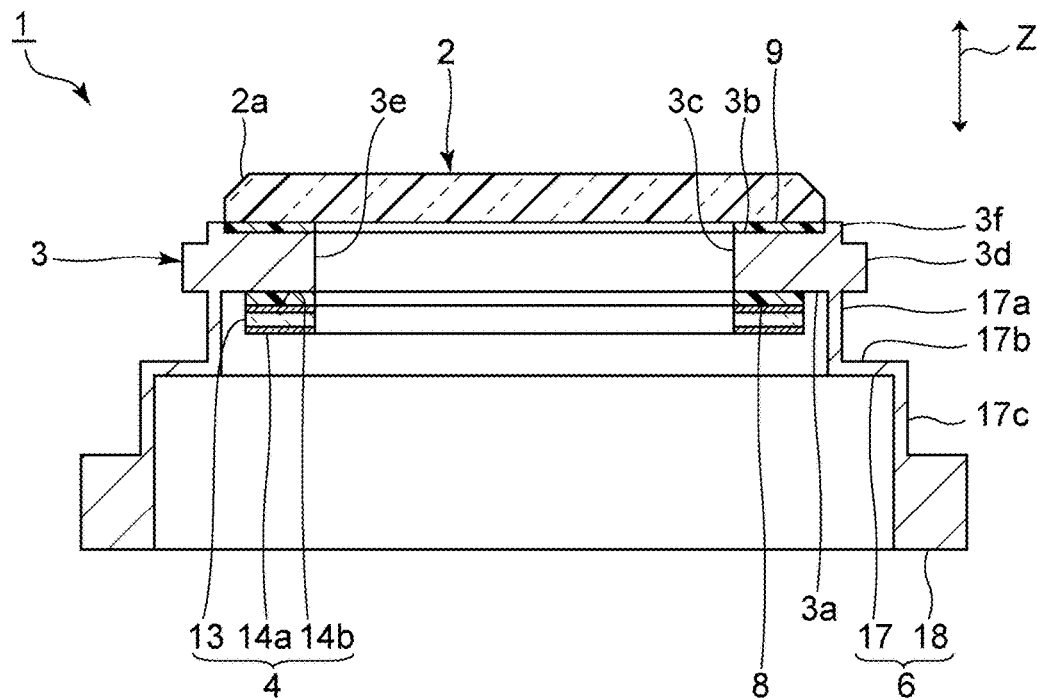
FIG. 1 is a front cross-sectional view of a vibration device according to a first preferred embodiment of the present invention.
Figure 2:
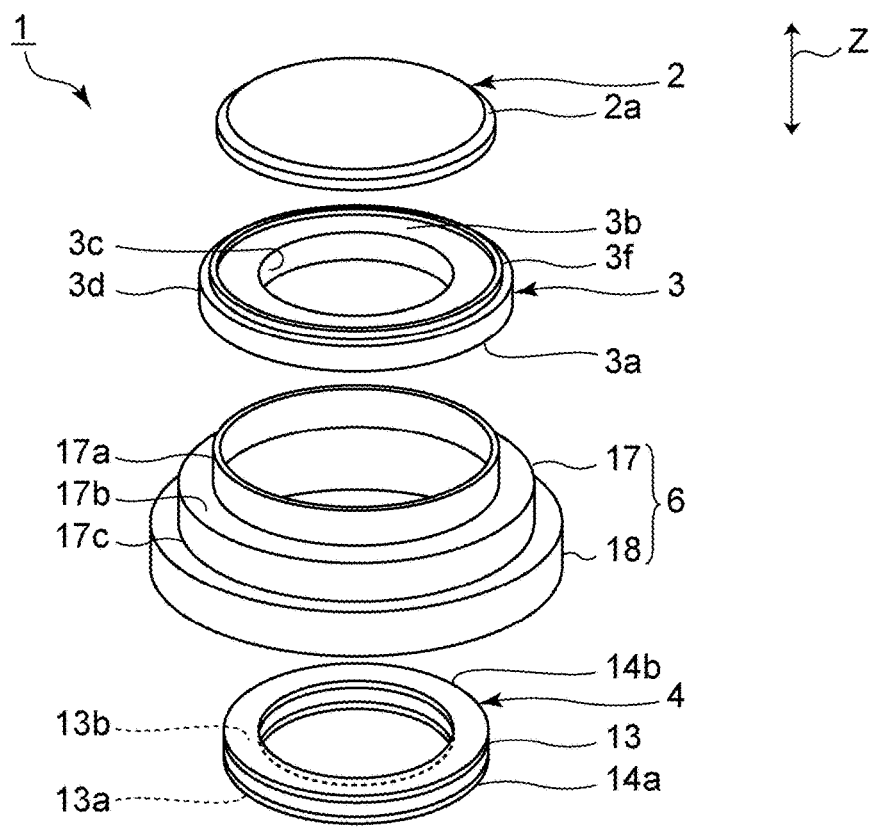
FIG. 2 is an exploded perspective view of the vibration device according to the first preferred embodiment of the present invention.

FIG. 1 is a front cross-sectional view of a vibration device according to a first preferred embodiment of the present invention. FIG. 2 is an exploded perspective view of the vibration device according to the first preferred embodiment.

A vibration device 1 illustrated in FIG. 1 and FIG. 2 is a vibration device that removes waterdrops or foreign matter from, for example, the field of vision of an image pickup device by moving the waterdrops or foreign matter with vibrations or by, for example, atomizing the waterdrops or other matter. The vibration device 1 includes a translucent cover 2, a tubular body 3, a piezoelectric device 4, and a holder 6. As illustrated in FIG. 1, the vibration device 1 includes a first adhesive layer 8 and a second adhesive layer 9. The tubular body 3 and the piezoelectric device 4 are joined together with the first adhesive layer 8. The tubular body 3 and the translucent cover 2 are joined together with the second adhesive layer 9.

The translucent cover 2, the tubular body 3, and the holder 6 define an internal space. The internal space accommodates an optical detector, for example, an image pickup device. Herein, instead of an enclosed space, the internal space may be a space partially open to an exterior of the vibration device 1.

The structure of the vibration device 1 according to the first preferred embodiment is described below.

The tubular body 3 includes a cavity $3e$, a first opening end surface $3a$, and a second opening end surface $3b$. Here, a direction connecting the first opening end surface $3a$ and the second opening end surface $3b$ of the tubular body 3 is referred to as an axial direction Z, and a direction orthogonal or substantially orthogonal to the axial direction Z is referred to as a radial direction. The tubular body 3 extends in the axial direction Z. The tubular body 3 has an internal surface $3c$ and an external surface $3d$. The internal surface $3c$ and the external surface $3d$ are connected to the first opening end surface $3a$ and the second opening end surface $3b$.

The first opening end surface $3a$ is flat or substantially flat. The second opening end surface $3b$ includes a wall $3f$ thereon. The wall $3f$ has an annular shape. In a plan view, the wall $3f$ is located between an outer periphery and an inner periphery of the tubular body 3. A portion of the second opening end surface $3b$ located inward from the wall $3f$ in the radial direction is flat. The wall $3f$ may be omitted. Herein, a plan view is referred to as a view from above in the axial direction Z. Above in the axial direction Z corresponds to the upper side of FIG. 1.

In the first preferred embodiment, the tubular body 3 has a cylindrical or substantially cylindrical shape. Instead of a cylindrical or substantially cylindrical shape, the tubular body 3 may have, for example, an annular or substantially angular and tubular shape. The tubular body 3 includes metal. Instead of metal, the tubular body 3 may include, for example, a ceramic material.

The piezoelectric device 4 is joined to the first opening end surface $3a$ of the tubular body 3. More specifically, the first opening end surface $3a$ and the piezoelectric device 4 are joined to each other with the first adhesive layer 8. As illustrated in FIG. 2, the piezoelectric device 4 has an annular shape. The piezoelectric device 4 includes an annular piezoelectric body 13. The piezoelectric body 13 includes a first main surface $13a$ and a second main surface $13b$. More specifically, the first main surface $13a$ and the second main surface $13b$ face each other in the axial direction Z. The second main surface $13b$ is located closer to the tubular body 3.

The piezoelectric device 4 includes a first electrode $14a$ and a second electrode $14b$. The first electrode $14a$ is provided on the first main surface $13a$ of the piezoelectric body 13. The second electrode $14b$ is provided on the second main surface $13b$ of the piezoelectric body 13. The first electrode $14a$ and the second electrode $14b$ are opposite to each other. The first electrode $14a$ and the second electrode $14b$ have an annular shape. The first electrode $14a$ and the second electrode $14b$ may include metal. The first electrode $14a$ and the second electrode $14b$ may be electrodes made from metal thin films including, for example, Ag or Au. Here, the first electrode $14a$ and the second electrode $14b$ can be formed by, for example, sputtering.

The piezoelectric body 13 may include, for example, piezoelectric ceramics including lead zirconate titanate (PZT), lead titanate (PT), and (K, Na)NbO$_3$ or piezoelectric single crystals, for example, LiTaO$_3$ or LiNbO$_3$. The shape of the piezoelectric body 13 is not limited to the above.

As illustrated in FIG. 1, the holder 6 is connected to the first opening end surface $3a$ of the tubular body 3. The holder 6 includes a spring portion 17 and a bottom portion 18. A first end portion of the spring portion 17 is connected to the first opening end surface $3a$ of the tubular body 3. The bottom portion 18 is continuous with the second end portion of the spring portion 17. The spring portion 17 has a cross section with a stepped shape when taken in the axial direction Z. The bottom portion 18 has a cylindrical or substantially cylindrical shape. The shapes of the spring portion 17 and the bottom portion 18 are not limited to the above shapes. The spring portion 17 may have, for example, a cylindrical shape or an angular tubular shape. The bottom portion 18 may have, for example, an angular tubular shape.

The holder 6 is made of metal. Instead of metal, the holder 6 may be made of, for example, ceramics. The vibration device 1 includes, for example, the bottom portion 18 of the holder 6 fixed to an exterior surface of the vibration device 1.

As described above, in the first preferred embodiment, the holder 6 is connected to the tubular body 3. Here, the tubular body 3 and the holder 6 may be integrated together. In this case, the tubular body 3 includes a portion corresponding to the holder 6.

The translucent cover 2 is joined to the second opening end surface $3b$ of the tubular body 3. More specifically, the translucent cover 2 is joined to the second opening end surface $3b$ to cover the cavity $3e$ in the tubular body 3. The second opening end surface $3b$ and the translucent cover 2 are joined to each other with the second adhesive layer 9. The second adhesive layer 9 is located inward from the wall $3f$ in the radial direction.

The translucent cover 2 has a disk or substantially disk shape. The translucent cover 2 includes an inclined portion $2a$. More specifically, the inclined portion $2a$ connects the side surface of the translucent cover 2 and an outer main surface of the translucent cover 2 installed in the vibration device 1. The inclined portion $2a$ is inclined with respect to the radial direction. Herein, being inclined with respect to the radial direction refers to being inclined in a cross section taken in the axial direction Z. Instead of the above shape, the translucent cover 2 may have another shape such as a dome shape, for example. The translucent cover 2 may have, for example, a polygonal shape in a plan view.

Examples usable as the material of the translucent cover 2 include translucent plastics, quartz, borosilicate or sodalime glass, and translucent ceramics. Translucency herein refers to translucency that at least allows an energy line or light of a wavelength detectable by an optical detector, for example, the image pickup device, to pass through.

Here, the thickness of the first adhesive layer 8 is denoted with t1, and the thickness of the second adhesive layer 9 is denoted with t2. An absolute value of deformation of the first adhesive layer 8 in a thickness direction of the first adhesive layer 8 when the first adhesive layer 8 receives a specific stress in the thickness direction is denoted with |Δt1|, and an absolute value of deformation of the second adhesive layer 9 in a thickness direction of the second adhesive layer 9 when the second adhesive layer 9 receives a specific stress in the thickness direction is denoted with |Δt2|. In the first preferred embodiment, the relationship between |Δt1| and |Δt2| when the first adhesive layer and the second adhesive layer 9 receive the same stress is |Δt1|>|Δt2|. The first preferred embodiment is thus able to reduce the stress imposed on each component without reducing displacement of the translucent cover 2 to which waterdrops and other matter adhere. This feature is be described below together with the structures of the first adhesive layer 8 and the second adhesive layer 9.

Figure 3:
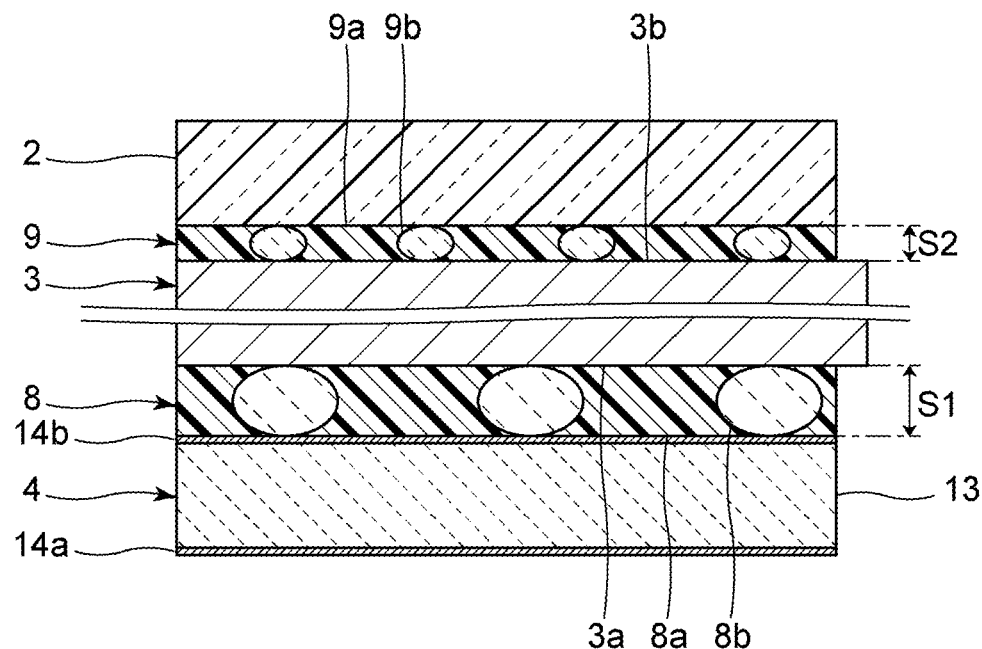
FIG. 3 is an enlarged, front cross-sectional view of the vibration device according to the first preferred embodiment of the present invention around a first adhesive layer and a second adhesive layer.

FIG. 3 is an enlarged, front cross-sectional view of the vibration device according to the first preferred embodiment around the first adhesive layer and the second adhesive layer.

The first adhesive layer 8 according to the first preferred embodiment includes a first resin layer 8a and first spacers 8b. The first spacers 8b are dispersed in the first resin layer 8a. Similarly, the second adhesive layer 9 includes a second resin layer 9a and second spacers 9b. The second spacers 9b are dispersed in the second resin layer 9a. The first resin layer 8a and the second resin layer 9a may include, for example, epoxy resin, acrylic resin, or silicone resin. The first spacers 8b and the second spacers 9b may include, for example, glass, metal, or ceramics. The shapes of the first spacers 8b and the second spacers 9b are not limited to particular shapes, but examples of the shapes include a ball shape, an oval shape, a solid cylindrical shape, and a solid prism shape.

The average height of the first spacers 8b is denoted with S1, and the average height of the second spacers 9b is denoted with S2. The height of the spacers is a dimension of the spacers in the axial direction Z. In the first preferred embodiment, S1>S2. Thus, the relationship t1>t2 is satisfied. The relationship satisfying t1>t2 satisfies |Δt1|>|Δt2|. The vibration device 1 with this structure is able to reduce the stress imposed on each component without reducing displacement of the translucent cover 2 to which waterdrops and other matter adhere. This feature is described below.

The inventors of preferred embodiments of the present invention have discovered that the sensitivity of vibration transmission efficiency with respect to the thickness of the adhesive layer significantly varies depending on the position of the adhesive layer. The inventors of preferred embodiments of the present invention have also discovered that the sensitivity of thermal stress with respect to the thickness of the adhesive layer significantly varies depending on the position of the adhesive layer.

More specifically, in joining of the tubular body 3 and the piezoelectric device 4, the vibration transmission efficiency is less likely to be reduced regardless of an increase of the thickness t1 of the first adhesive layer 8. In addition, thermal stress is significantly reduced in response to an increase of the thickness t1 of the first adhesive layer 8. By joining of the tubular body 3 and the translucent cover 2, thermal stress is less likely to be increased regardless of a reduction of the thickness t2 of the second adhesive layer 9. In contrast, the efficiency of vibration transmission from the tubular body 3 to the translucent cover 2 is significantly reduced in response to an increase of the thickness t2 of the second adhesive layer 9. Thus, the structure where t1>t2 does not significantly reduce the vibration transmission efficiency and does not significantly increase the thermal stress is provided. This feature is further described with reference to FIGS. 4 and 5. Hereinbelow, displacement or maximum displacement refers to displacement or maximum displacement of the translucent cover 2 at a center portion, unless otherwise particularly noted.

Maximum displacement of the translucent cover 2 was measured while changing the thickness t1 of the first adhesive layer 8 and the thickness t2 of the second adhesive layer 9. When the thickness t1 of the first adhesive layer 8 was changed, the thickness of the second adhesive layer 9 was fixed at about 10 μm. When the thickness t2 of the second adhesive layer 9 was changed, the thickness of the first adhesive layer 8 was fixed at about 10 μm. The measurement results are shown in FIG. 4.

Figure 4:
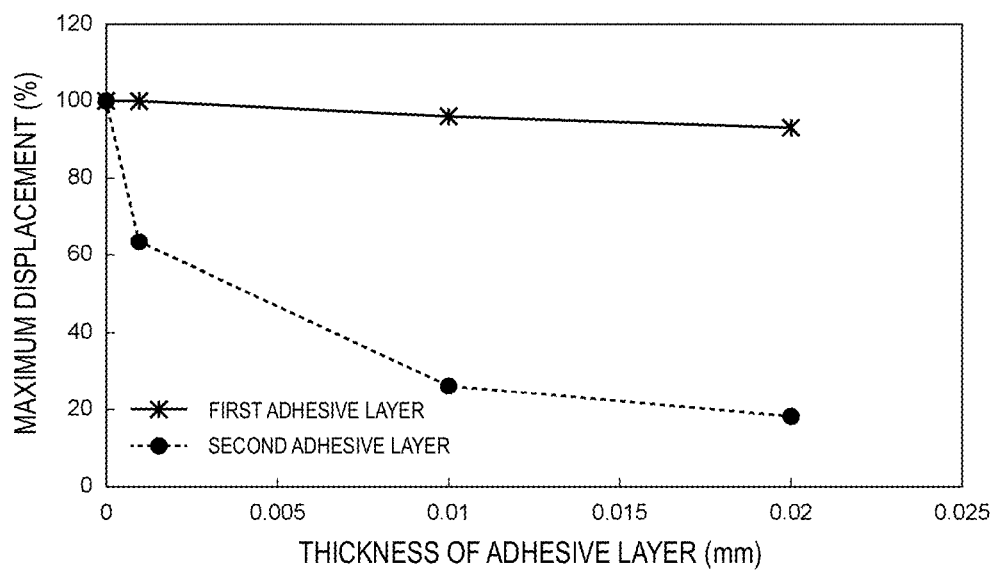
FIG. 4 is a graph showing the relationship between maximum displacement of a translucent cover according to the present invention and a thickness of an adhesive layer.

FIG. 4 is a graph showing the relationship between maximum displacement of the translucent cover and the thickness of the adhesive layer. Maximum displacement indicated on the vertical axis in FIG. 4 is 100% when no adhesive layer is provided.

As described above, the first adhesive layer 8 joins the tubular body 3 and the piezoelectric device 4 to each other. The second adhesive layer 9 joins the tubular body 3 and the translucent cover 2 to each other. As shown in FIG. 4, the change of maximum displacement of the translucent cover 2 remains relatively small regardless of a change of the thickness t1 of the first adhesive layer 8. Maximum displacement of the translucent cover 2 is significantly reduced with an increase of the thickness t2 of the second adhesive layer 9. Thus, the structure where t1>t2 does not significantly reduce maximum displacement of the translucent cover 2, as is described below.

The modulus of elasticity of a resin layer in an adhesive layer is relatively small. Thus, when vibrations are transmitted to the adhesive layer and stress is imposed on the adhesive layer, the adhesive layer is more likely to be deformed. As the adhesive layer is increasingly deformed, vibrations damp significantly. Thus, as the amplitude of vibrations transmitted to the adhesive layer is larger, the adhesive layer is increasingly deformed and vibrations damp significantly.

In the vibration device 1, fine vibrations excited by the piezoelectric device 4 are transmitted to the first adhesive layer 8, the tubular body 3, the second adhesive layer 9, and the translucent cover 2 in this order. During this vibration transmission, the amplitude of the vibrations is amplified. More specifically, a respiration vibration mode excited by the piezoelectric device 4 is converted into a vibration mode that causes the translucent cover 2 to vibrate in the axial direction Z in the tubular body 3. Here, the amplitude of the vibrations is amplified. Thus, the amplitude of the vibrations transmitted to the second adhesive layer 9 is larger than the amplitude of the vibrations transmitted to the first adhesive layer 8. Thus, the second adhesive layer 9 is significantly deformed when receiving the transmitted vibrations. As the thickness t2 of the second adhesive layer 9 is larger, the second adhesive layer 9 is more significantly deformed. Thus, the vibrations damp significantly. Accordingly, as the thickness t2 of the second adhesive layer 9 is larger, maximum displacement of the translucent cover 2 is reduced significantly.

As the adhesive layer has a smaller thickness, the entirety or substantially the entirety of the joined component has a larger Q-value. Thus, as the thickness t2 of the second adhesive layer 9 is smaller, maximum displacement of the translucent cover 2 is larger.

The vibrations transmitted to the first adhesive layer 8 have a small amplitude. Thus, regardless of an increase of the thickness t1 of the first adhesive layer 8, deformation of the first adhesive layer 8 is small. Accordingly, regardless of a change of the thickness t1 of the first adhesive layer 8, maximum displacement of the translucent cover 2 less easily changes.

Figure 5:
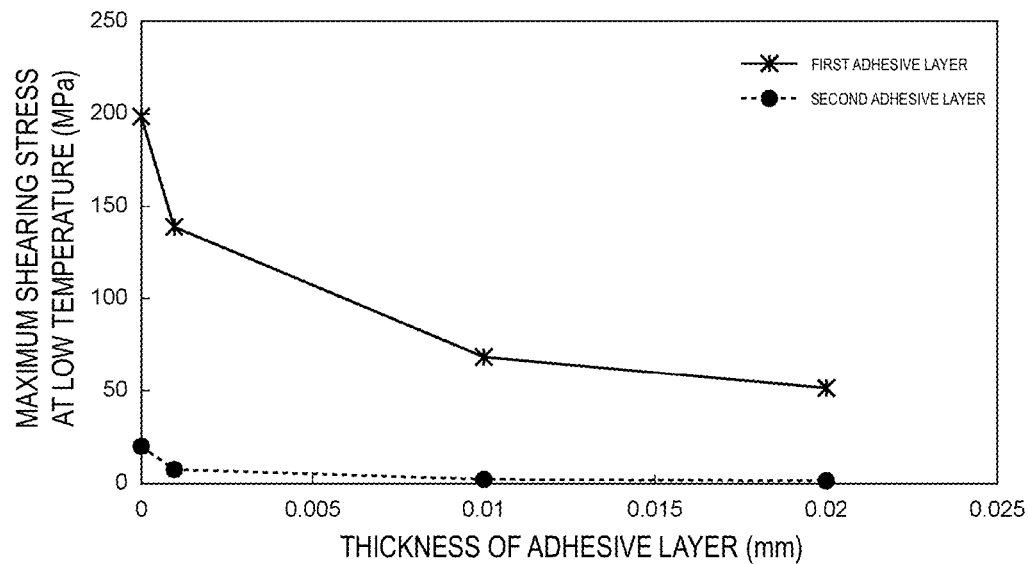
FIG. 5 is a graph showing the relationship between a maximum shearing stress under a low temperature imposed between a tubular body and a piezoelectric device, a maximum shearing stress under a low temperature imposed between the tubular body and a translucent cover, and a thickness of the adhesive layer.

Under about −40° C., the thickness t1 of the first adhesive layer 8 was changed, and the maximum shearing stress imposed between the tubular body 3 and the piezoelectric device 4 was measured. Under about −40° C., the thickness t2 of the second adhesive layer 9 was changed, and the maximum shearing stress imposed between the tubular body 3 and the translucent cover 2 was measured. Here, typically usable materials were used for the components. More specifically, stainless steel was provided for the tubular body 3. PZT was provided for the piezoelectric body 13 of the piezoelectric device 4. Soda glass was provided for the translucent cover 2. FIG. 5 shows these measurement results.

FIG. 5 is a graph showing the relationship between the maximum shearing stress imposed between the tubular body and the piezoelectric device at a relatively low temperature, the maximum shearing stress imposed between the tubular body and the translucent cover at a relatively low temperature, and the thickness of the adhesive layer.

FIG. 5 shows that the maximum shearing stress imposed between the tubular body 3 and the translucent cover 2 remains low regardless of a change of the thickness t2 of the second adhesive layer 9. FIG. 5 also shows that the maximum shearing stress imposed between the tubular body 3 and the piezoelectric device 4 is significantly reduced in response to an increase of the thickness t1 of the first adhesive layer 8.

Stainless steel provided for the tubular body 3 has a coefficient of linear expansion of within about 10 ppm/° C. to about 15° C. ppm/° C. Soda glass provided for the translucent cover 2 has a coefficient of linear expansion of about 11 ppm/° C. Thus, the tubular body 3 and the translucent cover 2 have a relatively small difference in coefficient of linear expansion. Accordingly, the maximum shearing stress imposed between the tubular body 3 and the translucent cover 2 is relatively small regardless of the thickness t2 of the second adhesive layer 9.

PZT used for the piezoelectric body 13 has a coefficient of linear expansion between approximately equal to or lower than about 5 ppm/° C. and equal to or lower than about 7 ppm/° C. Thus, the tubular body 3 and the piezoelectric body 13 has a relatively large difference in coefficient of linear expansion. Accordingly, the maximum shearing stress imposed between the tubular body 3 and the piezoelectric device 4 is large. Here, the presence of the first adhesive layer 8 reduces the maximum shearing stress imposed between the tubular body 3 and the piezoelectric device 4. An increase of the thickness t1 of the first adhesive layer 8 increases the effect of the stress reduction. Thus, in response to an increase of the thickness t1 of the first adhesive layer 8, the maximum shearing stress imposed between the tubular body 3 and the piezoelectric device 4 is reduced significantly. Accordingly, in a structure where t1>t2, the total thermal stress imposed on the translucent cover 2, the tubular body 3, and the piezoelectric device 4 is able to be reduced.

As described above, in a structure where t1>t2 and |Δt1|>|Δt2|, the stress imposed on each component is able to be reduced without reducing displacement of the translucent cover 2. This structure is able to provide the above features without changing the vibration device 1 into a complex shape. The vibration device 1 is thus able to be easily manufactured.

Each of the adhesive layers that join the piezoelectric device 4, the tubular body 3, and the translucent cover 2 to each other stably maintains these components joined for a long period of time and transmits vibrations. The first preferred embodiment is able to reduce the stress imposed on the components, and is thus able to stably keep the components joined. In addition, the first preferred embodiment provides preferable transmission of vibrations from the piezoelectric device 4 to the translucent cover 2, and at least partially prevents reduction of displacement of the translucent cover 2. The first preferred embodiment is thus able to satisfy the above demands on each adhesive layer.

Here, |Δt1| and |Δt2| can be measured with a tensile tester. Alternatively, whether |Δt1|>|Δt2| is satisfied is able to be determined by measuring the initial thickness t1 of the first adhesive layer 8 and the initial thickness t2 of the second adhesive layer 9. More specifically, |Δt1|=|t1·σ/E1| when the elastic constant of the first adhesive layer 8 is denoted with E1, and a specific stress σ is imposed on the first adhesive layer 8 in the thickness direction of the first adhesive layer 8. Similarly, |Δt2|=|t2·σ/E2| when the elastic constant of the second adhesive layer 9 is denoted with E2, and the specific stress 6 is imposed on the second adhesive layer 9 in the thickness direction of the second adhesive layer 9. Thus, whether |Δt1|>|Δt2| is satisfied is able to be determined by measuring the initial thickness t1 of the first adhesive layer 8 and the initial thickness t2 of the second adhesive layer 9 based on the elastic constant E1 and the elastic constant E2.

As shown in FIG. 3, in the first preferred embodiment, the first adhesive layer 8 includes the first spacers 8b. The second adhesive layer 9 includes the second spacers 9b. Here, S1>S2, and thus t1>t2. The structure where t1>t2 is not limited to the structure described above. For example, the structure may include the first adhesive layer 8 including the first spacers 8b and the second adhesive layer 9 excluding the second spacers 9b. Alternatively, the structure may include the first adhesive layer 8 excluding the first spacers 8b and the second adhesive layer 9 excluding the second spacers 9b. In such cases, the thickness t1 of the first adhesive layer 8 and the thickness t2 of the second adhesive layer 9 may be controlled by controlling, for example, the viscosity of resin included for the first adhesive layer 8 and the second adhesive layer 9 or the pressure imposed to cure the resin. Preferably, for example, the first adhesive layer 8 includes the first spacers 8b and the second adhesive layer 9 includes the second spacers 9b. This structure is able to improve the accuracy of the thickness t1 of the first adhesive layer 8 and the thickness t2 of the second adhesive layer 9.

In the first preferred embodiment, the vibration device 1 includes the piezoelectric device 4 to function as and define a vibrating element. The vibrating element may be an element different from the piezoelectric device, for example, an electromagnetic inductor. The electromagnetic inductor may include, for example, a solenoid coil and a magnet. Here, for example, the tubular body 3 and the magnet may be joined to each other with the first adhesive layer 8.

The structure of the holder 6 is described below. As shown in FIG. 1, the holder 6 includes the spring portion 17 and the bottom portion 18. The spring portion 17 has a shape of two cylinders connected stepwise. More specifically, the spring portion 17 includes a first portion 17a, a second portion 17b, and a third portion 17c. The first portion 17a and the third portion 17c have a cylindrical or substantially cylindrical shape. The first portion 17a and the third portion 17c extend in the axial direction Z. The second portion 17b has an annular shape. The second portion 17b connects the first portion 17a and the third portion 17c to each other. The first portion 17a is connected to the tubular body 3. The bottom portion 18 is continuous to the third portion 17c. The outside diameter of the first portion 17a is smaller than the outside diameter of the third portion 17c.

Here, the thickness of the holder 6 in the direction orthogonal or substantially orthogonal to the direction in which each portion of the holder 6 extends is defined as the thickness of the portion of the holder 6. In the holder 6, the thickness of the spring portion 17 is smaller than the thickness of the bottom portion 18. Thus, the spring portion 17 is more easily deformable than the bottom portion 18. Thus, the components of vibrations in the radial direction are absorbed with the elasticity of the spring portion 17. Here, vibration absorption with the spring portion 17 indicates the ability with which most part of the vibrations transmitted from the piezoelectric device 4 to the holder 6 can be changed to vibrations of the spring portion 17. This structure can thus hinder leakage of the vibrations to the bottom portion 18.

In addition, the bottom portion 18 having a relatively large thickness is less easily deformable. This structure is able to reduce or prevent leakage of vibrations to the bottom portion 18 of the holder 6. This structure is also able to reduce or prevent vibration damping when the bottom portion 18 is fixed to an exterior of the vibration device 1.

The spring portion 17 may exclude the first portion 17a, the second portion 17b, and the third portion 17c. The spring portion 17 may have, for example, a linear cross-sectional shape when taken in the axial direction Z.

In the first preferred embodiment, t1>t2, and thus |Δt1|>|Δt2|. The structure of the vibration device is not limited to the structure where t1>t2, and may be any structure that satisfies |Δt1|>|Δt2|.

A vibration device according to a second preferred embodiment of the present invention is described below. In the second preferred embodiment, the relationship in Young's modulus between the first adhesive layer and the second adhesive layer differs from that in the first preferred embodiment. Except for the above point, the vibration device according to the second preferred embodiment has the same or substantially the same structure as the vibration device 1 according to the first preferred embodiment. Thus, the vibration device according to the second preferred embodiment will be described with reference to FIG. 1.

In the second preferred embodiment, Y1<Y2 where the Young's modulus of the first adhesive layer 8 is denoted with Y1, and the Young's modulus of the second adhesive layer 9 is denoted with Y2. Thus, |Δt1|>|Δt2|. Thus, similar to the first preferred embodiment, the second preferred embodiment is also able to reduce stress imposed on each component without reducing displacement of the translucent cover 2 to which waterdrops and other matter adhere.

Preferably, glass frit is provided as the second adhesive layer 9. Here, the second adhesive layer 9 is preferably able to increase the Young's modulus Y2, for example. For example, epoxy resin, acrylic resin, or silicone resin may be used as the first adhesive layer 8. Here, the materials of the first adhesive layer 8 and the second adhesive layer 9 are not limited to particular materials, and may be any material satisfying Y1<Y2.

Figure 6:
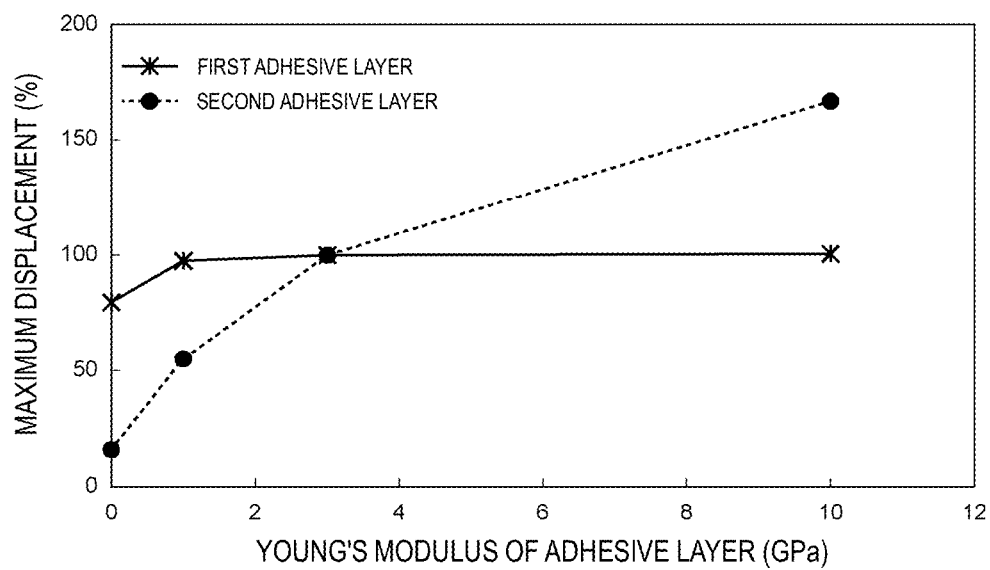
FIG. 6 is a graph showing the relationship between maximum displacement of the translucent cover and the Young's modulus of the adhesive layer.

FIG. 6 shows that the translucent cover 2 is less likely to be displaced. The maximum displacement of the translucent cover 2 was measured while changing the Young's modulus Y1 of the first adhesive layer 8 and the Young's modulus Y2 of the second adhesive layer 9. FIG. 6 shows the measurement results.

FIG. 6 shows the relationship between the maximum displacement of the translucent cover and the Young's modulus of the adhesive layer. Here, the maximum displacement indicated on the vertical axis in FIG. 6 is 100% when the Young's modulus of the adhesive layer is about 3 GPa.

FIG. 6 shows that the maximum displacement of the translucent cover 2 changes to a lesser extent regardless of a change of the Young's modulus Y1 of the first adhesive layer 8. FIG. 6 also shows that the maximum displacement of the translucent cover 2 significantly changes with a change of the Young's modulus Y2 of the second adhesive layer 9. Thus, in a structure where Y1<Y2, the maximum displacement of the translucent cover 2 is less easily reduced.

Figure 7:
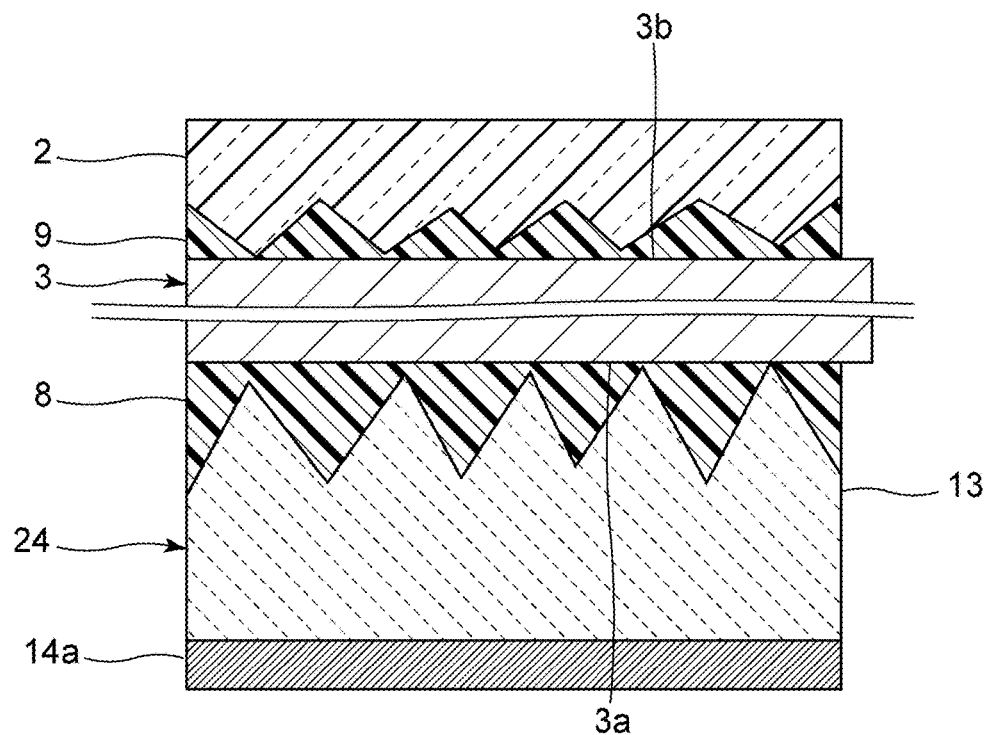
FIG. 7 is an enlarged, front cross-sectional view of a vibration device according to a third preferred embodiment of the present invention around a first adhesive layer and a second adhesive layer.

FIG. 7 is an enlarged, front cross-sectional view of a vibration device according to a third preferred embodiment of the present invention around a first adhesive layer and a second adhesive layer.

The third preferred embodiment differs from the first preferred embodiment with respect to the structure of a piezoelectric device 24, and the relationship in arithmetic mean roughness (Ra) between the piezoelectric device 24 and the translucent cover 2. Except for the above points, the vibration device according to the third preferred embodiment has the same or substantially the same structure as the vibration device 1 according to the first preferred embodiment. The arithmetic mean roughness herein is based on JIS B 0601:2013.

In the third preferred embodiment, the tubular body 3 includes metal. In the piezoelectric device 24, the tubular body 3 is provided as a second electrode. The piezoelectric device 24 thus excludes the second electrode 14b shown in FIG. 1. The tubular body 3 and the piezoelectric body 13 are thus joined with the first adhesive layer 8. Here, the first adhesive layer 8 preferably has a relatively small thickness to allow the tubular body 3 and the piezoelectric body 13 to be electrically connected to each other. Alternatively, the first adhesive layer 8 may be electrically conductive.

Here, Ra1>Ra2 where the arithmetic mean roughness of the surface of the piezoelectric device 24 that is in contact with the first adhesive layer 8 is denoted with Ra1, and the arithmetic mean roughness of the surface of the translucent cover 2 that is in contact with the second adhesive layer 9 is denoted with Ra2. Thus, |Δt1|>|Δt2|. As in the case of the first preferred embodiment, stress imposed on each component can thus be reduced without reducing displacement of the translucent cover 2 to which waterdrops and other matter adhere.

In the third preferred embodiment, a portion of the piezoelectric body 13 that is in contact with the first adhesive layer 8 has an arithmetic mean roughness that is equal or substantially equal to the arithmetic mean roughness Ra1. When the piezoelectric device 24 includes the second electrode 14b shown in FIG. 1, a portion of the second electrode 14b that is in contact with the first adhesive layer 8 has an arithmetic mean roughness that is equal or substantially equal to the arithmetic mean roughness Ra1.

Figure 8:
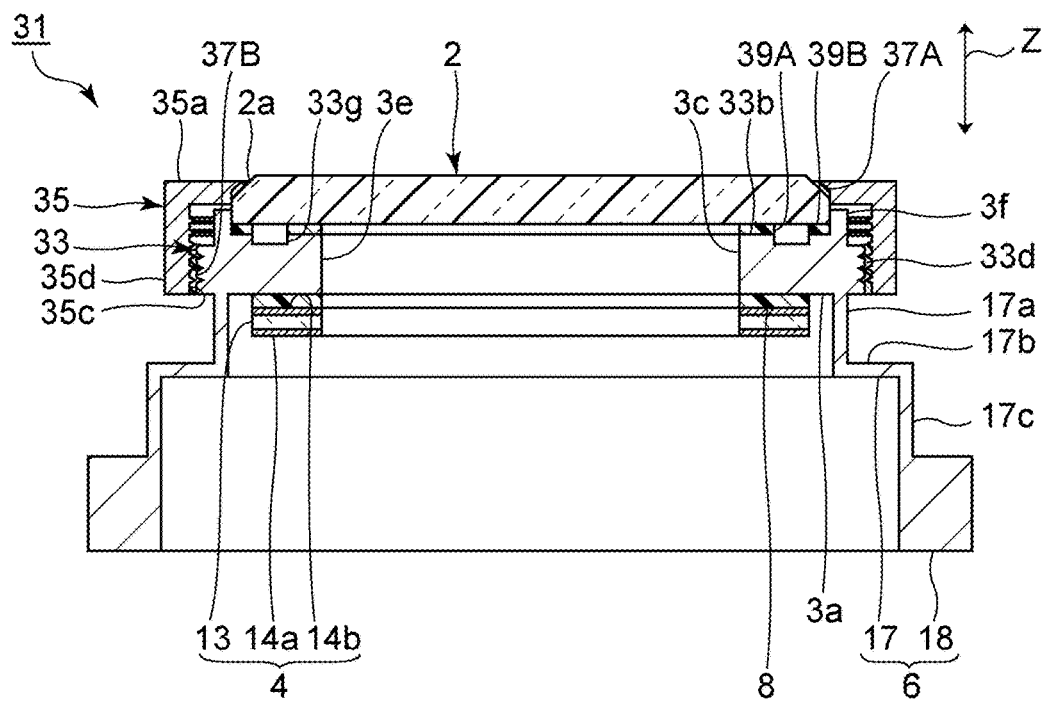
FIG. 8 is a front cross-sectional view of a vibration device according to a fourth preferred embodiment of the present invention.

FIG. 8 is a front cross-sectional view of a vibration device according to a fourth preferred embodiment of the present invention.

The fourth preferred embodiment differs from the first preferred embodiment in that a vibration device 31 includes a retainer 35, the features of the adhesive layer, and the structure of a tubular body 33. Except for the above points, the vibration device 31 according to the fourth preferred embodiment has the same or substantially the same structure as the vibration device 1 according to the first preferred embodiment.

The retainer 35 has a cylindrical or substantially cylindrical shape. The retainer 35 has a substantially L-shaped cross section when taken in the axial direction Z. The retainer 35 includes an internal surface 35c and an external surface 35d, and includes a top board 35a. The top board 35a includes a cavity. The inner periphery of the top board 35a is joined to the inclined portion 2a of the translucent cover 2. The internal surface 35c of the retainer 35 is joined to an external surface 33d of the tubular body 33.

Here, the internal surface 35c of the retainer 35 includes a helical ridge and a helical furrow. Similarly, the external surface 33d of the tubular body 33 includes a helical ridge and a helical furrow. Thus, the tubular body 33 corresponds to a male thread. The retainer 35 corresponds to a female thread. In the fourth preferred embodiment, the external surface 33d of the tubular body 33 and the internal surface 35c of the retainer 35 are fitted to each other. In addition, the translucent cover 2 is held between a second opening end surface 33b of the tubular body 33 and the top board 35a of the retainer 35. Thus, the translucent cover 2 is fixed by the tubular body 33 and the retainer 35.

In addition, the inner periphery of the top board 35a of the retainer 35 and the inclined portion 2a of the translucent cover 2 are joined to each other with an adhesive layer 37A. The external surface 33d of the tubular body 33 and the internal surface 35c of the retainer 35 are joined to each other with an adhesive layer 37B.

The second opening end surface 33b of the tubular body 33 includes a grooved portion 33g. The second opening end surface 33b is not joined to the translucent cover 2 at the grooved portion 33g. In the fourth preferred embodiment, two second adhesive layers are provided. More specifically, a second adhesive layer 39A is provided on the inner side of the grooved portion 33g in the radial direction. A second adhesive layer 39B is provided on the outer side of the grooved portion 33g in the radial direction.

As described above, the tubular body 33 and the retainer 35 respectively correspond to a male thread and a female thread. Thus, the tubular body 33 and the retainer 35 are able to be fixed to each other by a screwing operation. Here, compression stress is imposed in the axial direction Z between the second opening end surface 33b of the tubular body 33 and the top board 35a of the retainer 35. Here, in the vibration device 31, the translucent cover 2 is held between the second opening end surface 33b of the tubular body 33 and the top board 35a of the retainer 35. The second adhesive layers 39A and 39B are provided between the tubular body 33 and the translucent cover 2. The retainer 35 thus imposes compression stress on the second adhesive layers 39A and 39B. Thus, the thickness t2 of the second adhesive layers 39A and 39B is able to be further reliably reduced than the thickness t1 of the first adhesive layer 8.

In the fourth preferred embodiment, t1>t2, and thus |Δt1|>|Δt2|. Thus, as in the case of the first preferred embodiment, stress imposed on each component can be reduced without reducing displacement of the translucent cover 2 to which waterdrops and other matter adhere.

Figure 9:
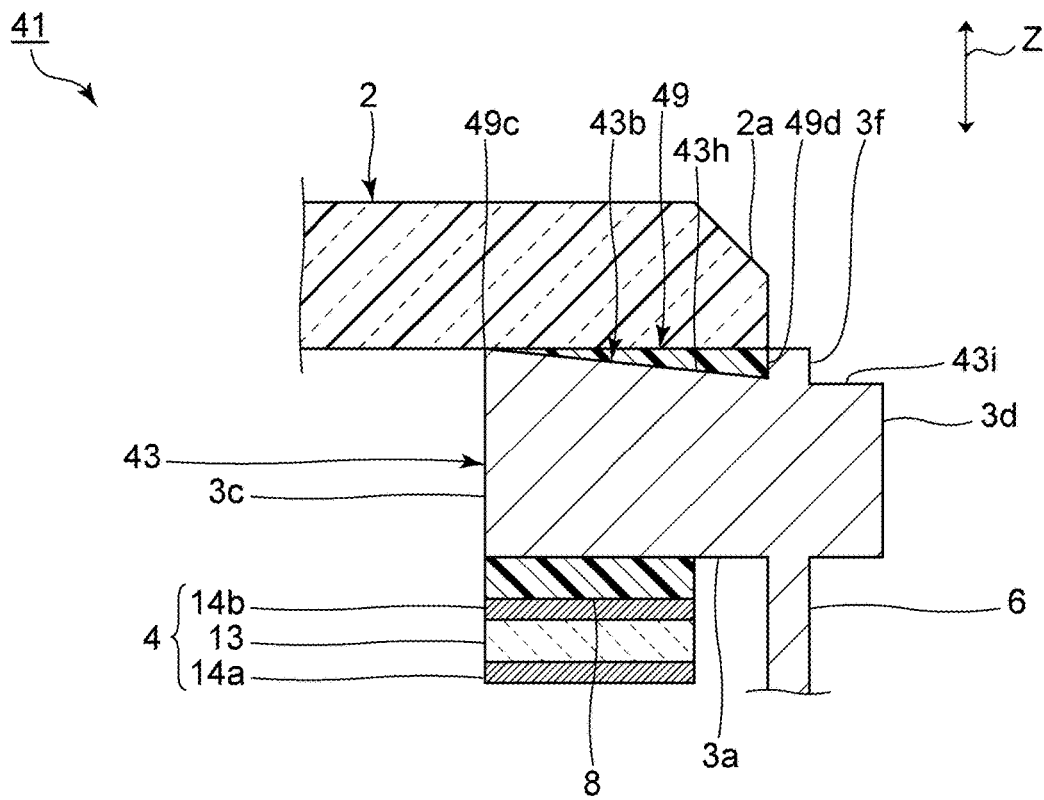
FIG. 9 is an enlarged, front cross-sectional view of a vibration device according to a fifth preferred embodiment of the present invention around a first adhesive layer and a second adhesive layer.

FIG. 9 is an enlarged, front cross-sectional view of a vibration device according to a fifth preferred embodiment of the present invention around a first adhesive layer and a second adhesive layer.

The fifth preferred embodiment differs from the first preferred embodiment in the structures of a second adhesive layer 49 and a tubular body 43. Except for the above points, a vibration device 41 according to the fifth preferred embodiment has the same or substantially the same structure as the vibration device 1 according to the first preferred embodiment.

A second opening end surface 43b of the tubular body 43 has an inclined portion 43h and a non-inclined portion 43i. The inclined portion 43h is inclined with respect to the radial direction. The second opening end surface 43b in the inclined portion 43h is inclined outward in the radial direction toward the first opening end surface 3a. The non-inclined portion 43i is parallel or substantially parallel to the radial direction. The non-inclined portion 43i includes a wall 3f thereon. The inclined portion 43h is provided on the inner side of the wall 3f in the radial direction. More specifically, the internal edge of the inclined portion 43h in the radial direction is connected to the internal surface 3c. The external edge of the inclined portion 43h in the radial direction is connected to a portion of the non-inclined portion 43i on which the wall 3f is provided. The external edge of the non-inclined portion 43i in the radial direction is connected to the external surface 3d.

The second adhesive layer 49 is provided on the inclined portion 43h of the second opening end surface 43b in the tubular body 43. The second adhesive layer 49 has an internal edge 49c and an external edge 49d. The internal edge 49c is on the inner side in the radial direction. The external edge 49d is on the outer side in the radial direction. In the fifth preferred embodiment, the second adhesive layer 49 increases its thickness from the inner side in the radial direction to the outer side in the radial direction. Here, t2i<t2o where the thickness of the second adhesive layer 49 at the internal edge 49c is denoted with t2i and the thickness of the second adhesive layer 49 at the external edge 49d is denoted with t2o.

In the fifth preferred embodiment, t2i<t2o, and thus |Δt1|>|Δt2|. As in the case of the first preferred embodiment, stress imposed on each component can thus be reduced without reducing displacement of the translucent cover 2 to which waterdrops and other matter adhere.

Instead of the relationship of t2i<t2o, the structure may be any structure satisfying |Δt1|>|Δt2|. For example, the relationship in Young's modulus between the first adhesive layer 8 and the second adhesive layer 49 may be the same or substantially the same as the second preferred embodiment. Alternatively, the relationship in arithmetic mean roughness between the piezoelectric device 4 and the translucent cover 2 may be the same or substantially the same as the third preferred embodiment.

In the vibration device 41, the translucent cover 2 is displaced largest at the center portion. The displacement of the translucent cover 2 increases from the outer side in the radial direction toward the inner side in the radial direction. In contrast, the thickness of the second adhesive layer 49 decreases from the outer side in the radial direction toward the inner side in the radial direction. Thus, the portion of the second adhesive layer 49 that is in contact with a portion of the translucent cover that is displaced to a large extent has a relatively small thickness. In contrast, a portion of the second adhesive layer 49 that is in contact with a portion of the translucent cover 2 that is displaced to a small extent has a relatively large thickness. This structure is able to improve the vibration efficiency of the translucent cover 2. This feature is described with reference to FIG. 10.

The amplitude of vibrations of the translucent cover 2 was measured while changing the thickness t2i of the second adhesive layer 49 at the internal edge 49c and the thickness t2o of the second adhesive layer 49 at the external edge 49d. The measurement results are illustrated in FIG. 10.

Figure 10:
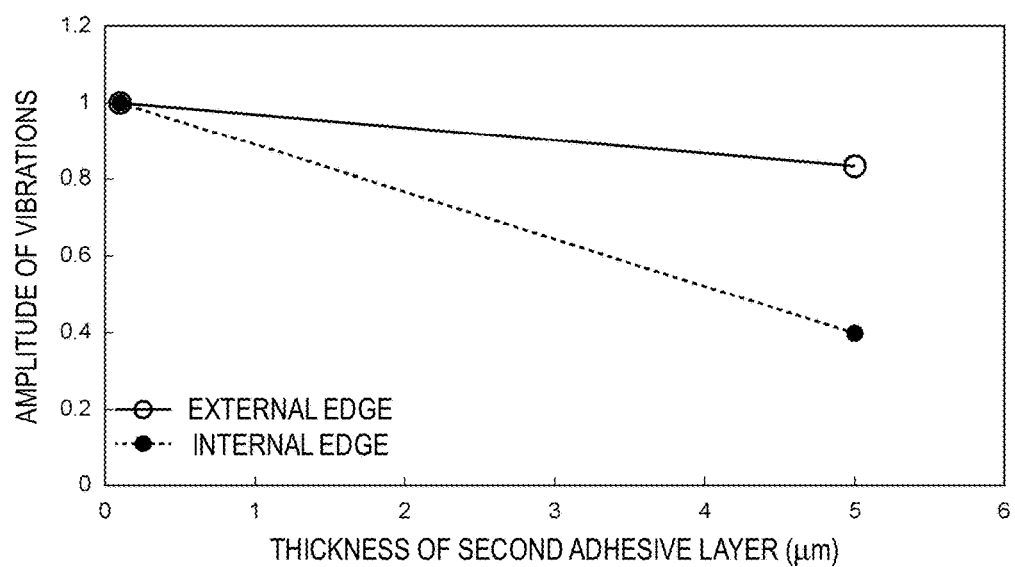
FIG. 10 is a graph showing the relationship between the amplitude of vibrations of a translucent cover and the thickness of a second adhesive layer.

FIG. 10 is a graph showing the relationship between the amplitude of vibrations of a translucent cover and the thickness of a second adhesive layer. The amplitude of vibrations indicated on the vertical axis in FIG. 10 is a value specified by a standard amplitude.

FIG. 10 shows that the amplitude of vibrations of the translucent cover 2 changes to a lesser extent regardless of a change of the thickness t2o of the second adhesive layer 49 at the external edge 49d. The amplitude of vibrations of the translucent cover 2 is significantly reduced in response to an increase of the thickness t2i of the second adhesive layer 49 at the internal edge 49c. In the fifth preferred embodiment, t2i<t2o. This structure is able to effectively improve the vibration efficiency of the translucent cover 2. This structure is also able to increase the thickness t2o of the second adhesive layer 49 at the external edge 49d while reducing the thickness t2i of the second adhesive layer at the internal edge 49c, and thus is able to improve the adhesion between the tubular body 43 and the translucent cover 2.

Figure 11:
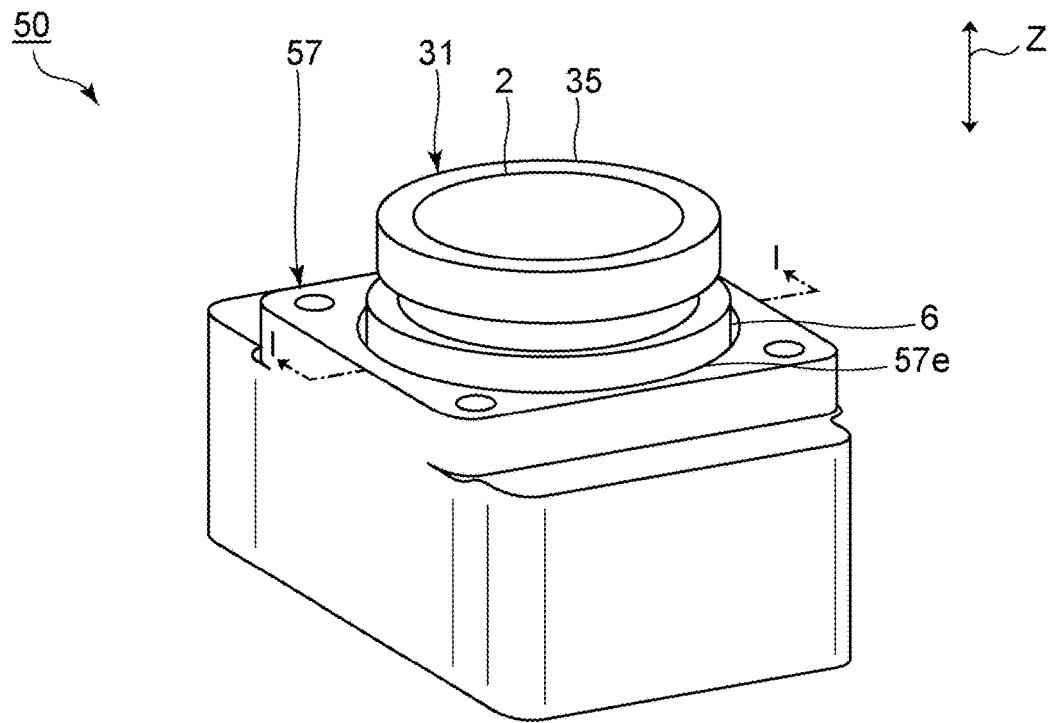
FIG. 11 is a perspective view of an imaging device according to a sixth preferred embodiment of the present invention.
Figure 12:
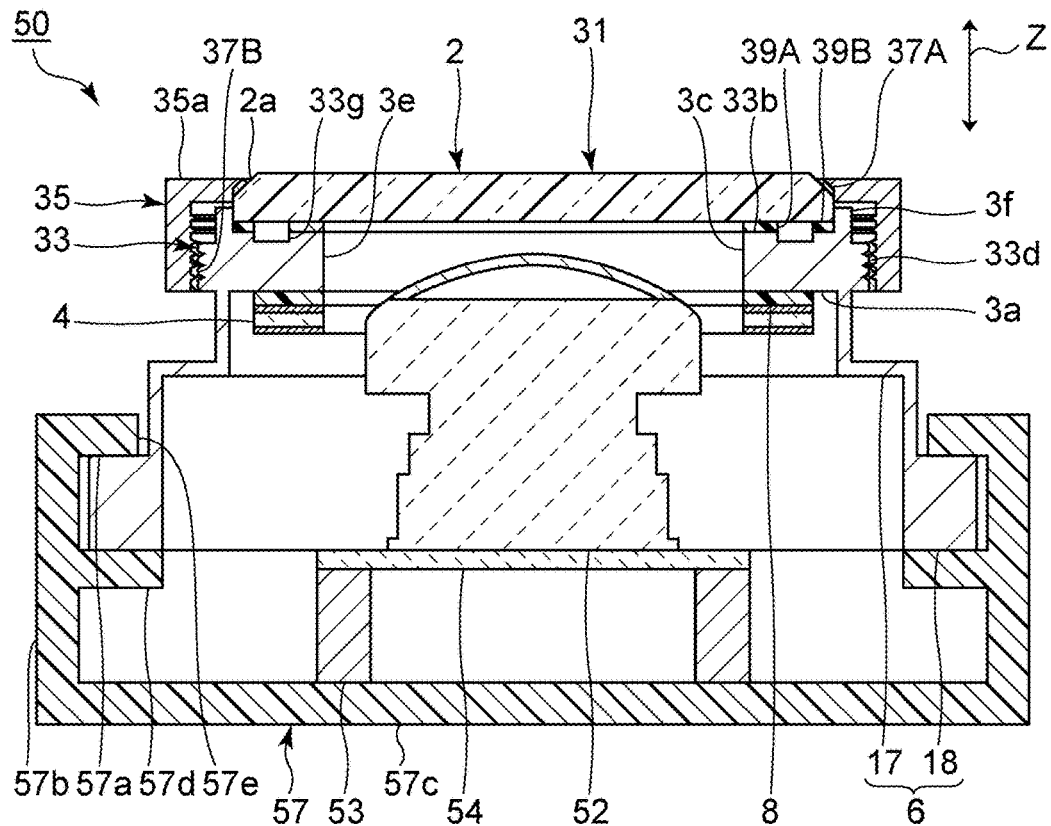
FIG. 12 is a cross-sectional view of the imaging device taken along line I-I in FIG. 11.

FIG. 11 is a perspective view of an imaging device according to a sixth preferred embodiment. FIG. 12 is a cross-sectional view taken along line I-I in FIG. 11.

As illustrated in FIGS. 11 and 12, an imaging device 50 functioning as and defining an optical detector includes the vibration device 31 according to the fourth preferred embodiment and a case 57. The vibration device of the imaging device 50 is not limited to the vibration device 31 according to the fourth preferred embodiment. The vibration device of the imaging device 50 may be, for example, any of the vibration devices according to the first, second, third, and fifth preferred embodiments. That is, the vibration device may be any vibration device according to the preferred embodiments of the present invention.

As shown in FIG. 12, the case 57 includes a top board 57a, a wall 57b, and a bottom board 57c. The wall 57b is connected to the top board 57a and the bottom board 57c. The top board 57a includes a cavity 57e. A portion of the vibration device 31 protrudes from the cavity 57e to an exterior of the case 57. More specifically, the translucent cover 2 of the vibration device 31 is located at an exterior of the case 57.

In the sixth preferred embodiment, the vibration device 31 is fixed to the case 57 at the bottom portion 18 of the holder 6. This structure reduces or prevents vibrations of the vibration device 31 from leaking to the case 57. More specifically, the case 57 includes a mount portion 57d. The mount portion 57d extends in the inner side of the case 57 from the wall 57b in the direction orthogonal or substantially orthogonal to the axial direction Z. The bottom portion 18 of the holder 6 is held between the mount portion 57d and the top board 57a. In addition, the bottom portion 18 is screwed on the case 57 to be fixed to the case 57. The structure to fix the vibration device 31 and the case 57 is not limited to the above.

As illustrated in FIG. 12, the imaging device 50 also includes an image pickup device 52. The image pickup device 52 is provided in an internal space defined by the vibration device 31 and the case 57. More specifically, a leg 53 is provided on the bottom board 57c of the case 57. A substrate 54 is provided on the leg 53. The image pickup device 52 is provided on the substrate 54. The structure inside the case 57 is not limited to the above.

Elements other than the image pickup device 52 may be provided in the internal space defined by the vibration device 31 and the case 57. For example, a heater, a driving circuit of the image pickup device 52, or a control circuit of the piezoelectric device 4 may be included instead. The control circuit is a circuit that vibrates the piezoelectric device 4 at the resonant frequency.

Examples of the image pickup device 52 include a complementary metal oxide semiconductor (CMOS), a charge-coupled device (CCD), a bolometer, and a thermopile that receive light of any wavelength within a visible region to a far infrared region. Examples of the imaging device 50 include a camera, a radar, and a lidar device.

Instead of the image pickup device 52, an optical detector that optically detects an energy line may be located in the internal space defined by the vibration device 31 and the case 57. Examples of the detected energy line include an activated energy line such as electromagnetic waves and infrared radiation. A detection area of the optical detector is included in the translucent cover 2. In the imaging device 50 illustrated in FIG. 12, the field of vision of the image pickup device 52, serving as the detection area, is included in the translucent cover 2.

The imaging device 50 includes the vibration device 31 according to the fourth preferred embodiment. Thus, the imaging device 50 can reduce stress imposed on each component without reducing displacement of the translucent cover 2 to which waterdrops and other matter adhere.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device, comprising:
   a tubular body including a cavity, a first opening end surface, and a second opening end surface;
   a vibrating element joined to the first opening end surface of the tubular body; and
   a translucent cover joined to the second opening end surface of the tubular body to cover the cavity of the tubular body; wherein
   the tubular body and the vibrating element are joined to each other with a first adhesive layer;
   the tubular body and the translucent cover are joined to each other with a second adhesive layer;
   when a thickness of the first adhesive layer is denoted as t1, a thickness of the second adhesive layer is denoted as t2, an absolute value of deformation of the first adhesive layer in a thickness direction of the first adhesive layer when a first stress is imposed on the first adhesive layer in the thickness direction is denoted with $|\Delta t1|$, and an absolute value of deformation of the second adhesive layer in a thickness direction of the second adhesive layer when a second stress is imposed on the second adhesive layer in the thickness direction is denoted with $|\Delta t2|$, a relationship between the absolute value $|\Delta t1|$ and the absolute value $|\Delta t1|$ when the first adhesive layer and the second adhesive layer receive equal stress is $|\Delta t1|>|\Delta t2|$.

2. The vibration device according to claim 1, wherein t1>t2.

3. The vibration device according to claim 1, wherein
the first adhesive layer includes first spacers, and the second adhesive layer includes second spacers; and
S1>S2, where an average height of the first spacers is denoted as S1, and an average height of the second spacers is denoted as S2.

4. The vibration device according to claim 1, wherein Y1<Y2, where a Young's modulus of the first adhesive layer is denoted as Y1 and a Young's modulus of the second adhesive layer is denoted as Y2.

5. The vibration device according to claim 1, wherein Ra1>Ra2, where arithmetic mean roughness of a surface of the vibrating element that is in contact with the first adhesive layer is denoted as Ra1, and arithmetic mean roughness of a surface of the translucent cover that is in contact with the second adhesive layer is denoted as Ra2.

6. The vibration device according to claim 1, further comprising a retainer that fixes the tubular body and the translucent cover to each other, and imposes compression stress on the second adhesive layer.

7. The vibration device according to claim 1, wherein
when a direction connecting the first opening end surface and the second opening end surface of the tubular body is defined as an axial direction, the second adhesive layer includes an internal edge located on an inner side in a direction orthogonal or substantially orthogonal to the axial direction, and an external edge located on an outer side in the direction orthogonal or substantially orthogonal to the axial direction; and
t2i<t2o, where a thickness of the second adhesive layer at the internal edge is denoted as t2i and a thickness of the second adhesive layer at the external edge is denoted as t2o.

8. The vibration device according to claim 1, wherein the vibrating element is a piezoelectric device.

9. The vibration device according to claim 1, further comprising a holder connected to the first opening end surface of the tubular body.

10. The vibration device according to claim 9, wherein
the holder includes a spring portion and a bottom portion;
the spring portion has a stepped shape in a cross section taken in an axial direction of the vibration device; and
the bottom portion has a cylindrical or substantially cylindrical shape.

11. The vibration device according to claim 9, wherein the translucent cover, the tubular body, and the holder define an internal space.

12. The vibration device according to claim 11, wherein an optical detector is provided in the internal space.

13. The vibration device according to claim 1, wherein
the first opening end surface of the tubular body is flat is substantially flat; and
the second opening end surface of the tubular body includes a wall with an annular shape.

14. The vibration device according to claim 1, wherein the translucent cover includes an inclined portion.

15. The vibration device according to claim 3, wherein the first adhesive layer further includes a first resin layer, and the second adhesive layer further includes a second resin layer.

16. The vibration device according to claim 1, wherein the vibrating element includes a first electrode and a second electrode.

17. The vibration device according to claim 16, wherein the first electrode and the second electrode are provided on opposing surfaces of the vibrating element.

* * * * *